United States Patent [19]
Jang et al.

[11] Patent Number: 6,031,786
[45] Date of Patent: Feb. 29, 2000

[54] OPERATION CONTROL CIRCUITS AND METHODS FOR INTEGRATED CIRCUIT MEMORY DEVICES

[75] Inventors: Tae-seong Jang; Sung-keun Lee, both of Kyungki-do, Rep. of Korea

[73] Assignee: Samsung Electronics Co., Ltd., Rep. of Korea

[21] Appl. No.: 09/134,807

[22] Filed: Aug. 14, 1998

[30] Foreign Application Priority Data

Dec. 1, 1997 [KR] Rep. of Korea .................. 97-65045

[51] Int. Cl.⁷ .................................................. G11C 13/00
[52] U.S. Cl. .............................................. 365/233; 365/226
[58] Field of Search .................................. 365/226, 233, 365/227, 189.01, 230.01

[56] References Cited

U.S. PATENT DOCUMENTS

5,267,218  11/1993  Elbert ................................. 365/226

Primary Examiner—Terrell W. Fears
Attorney, Agent, or Firm—Myers Bigel Sibley & Sajovec

[57] ABSTRACT

An operation control circuit of an integrated circuit memory device operates in a synchronous mode according to an internal clock signal. An internal clock controller generates an internal clock enable signal in response to a mode command. An internal clock generator generates the internal clock signal based on the internal clock enable signal and an external clock. In particular, an internal clock controller generates an internal clock enable signal in response to a mode command. Accordingly, the integrated circuit memory device may be free of a clock enable pin.

25 Claims, 9 Drawing Sheets

OPERATION CONTROL CIRCUITS AND METHODS FOR INTEGRATED CIRCUIT MEMORY DEVICES

FIELD OF THE INVENTION

The present invention relates to operation of integrated circuit memory devices in general and, in particular, to synchronous operation of integrated circuit memory devices.

BACKGROUND OF THE INVENTION

As the operational complexity of integrated circuit memory devices increases, the demands on the testing of the integrated circuit memory devices may also increase. Accordingly, techniques to reduce the requirements of integrated circuit memory device testers have been researched, including techniques for simultaneously testing multiple integrated circuit memory devices during the manufacturing process.

Figure 1:
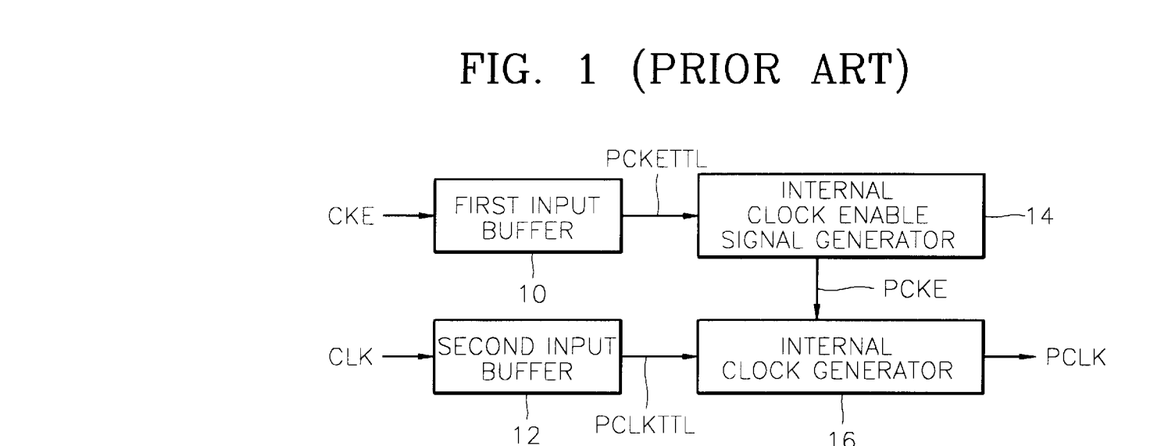
FIG. 1 is a block diagram illustrating operation control circuits and methods of integrated circuit memory devices according to the prior art.

FIG. 1 is a block diagram of an operation control circuit according to the prior art. A system clock (CLK) may be provided to the integrated circuit memory device operating in a synchronous mode. A clock enable signal (CKE) may also be provided to the integrated circuit memory device to enable and disable the generation of an internal clock for operation during a synchronous mode. The system clock and the clock enable signal may be combined to produce the internal clock (PCLK) synchronous to the system clock. The internal clock may then be enabled upon the assertion of CKE and disabled during the deassertion of CKE. In particular, the clock enable may be provided to an internal clock enable signal generator 14 via a first input buffer 10. Similarly, the system clock may be provided to an internal clock generator 16 via a second input buffer 12.

Figure 2:
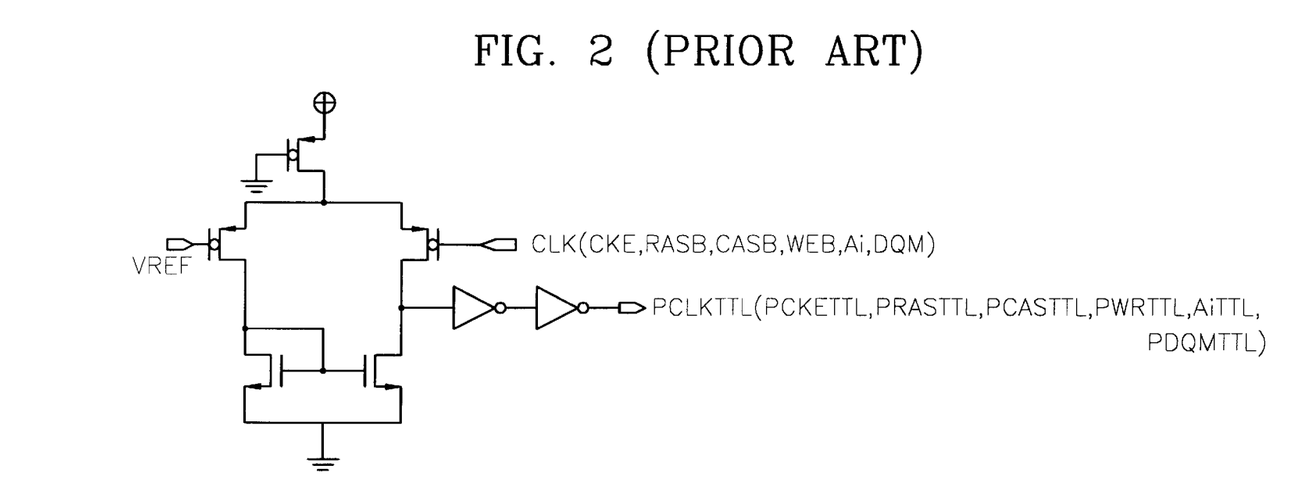
FIG. 2 is a circuit diagram of an input buffer according to the prior art.

FIG. 2 is a circuit diagram of an input buffer in an integrated circuit memory device according to the prior art. In particular, the input buffer may be used to implement the first input buffer 10 and second input buffer 12 in FIG. 1. The input buffer may be constructed using differential amplifiers so that the input buffer generates an output signal having a phase which is the opposite of a signal applied to the input buffer. For example, in FIG. 1, the second input buffer 12 inverts the system clock, to provide the PCLKTTL signal. Furthermore, the input buffer may convert the voltage level of the input signal. For example, the second input buffer 12 may convert a system clock having a TTL voltage level to a PLCKTTL having a CMOS voltage level.

Figure 3:
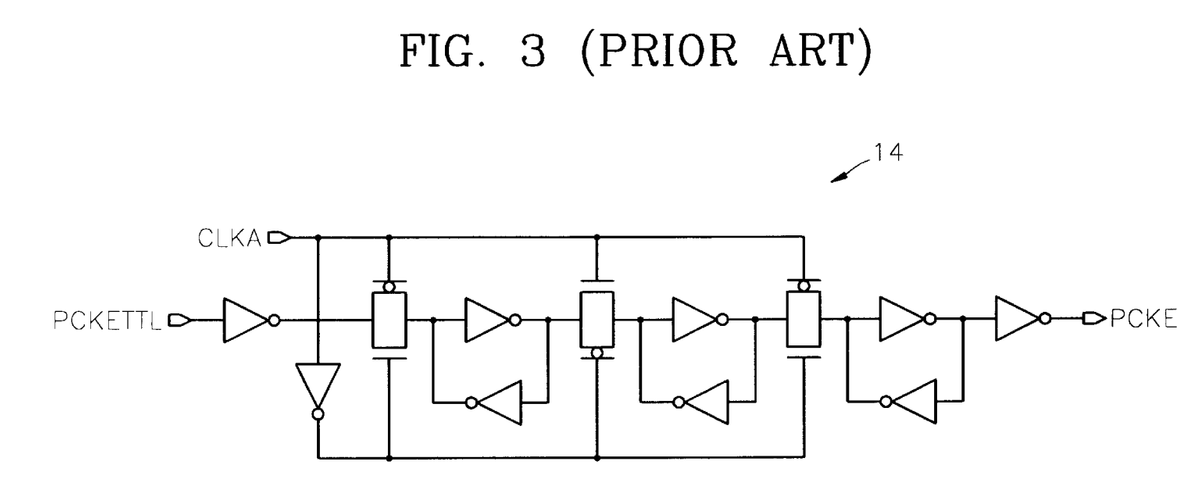
FIG. 3 is a circuit diagram of an internal clock enable signal generator according to the prior art.

FIG. 3 is a circuit diagram of an internal clock enable signal generator 14 of FIG. 1. The clock enable signal generator 14 receives the PCKETTL signal from the first input buffer 10, and generates a synchronous PCLK enable signal (PCKE). The PCKE signal is synchronous to the operation of a CLKA signal. The CLKA signal is an internal clock signal generated synchronous with PCLKTTL. The clock enable signal generator 14, therefore, may create a synchronous PCKE signal that is valid for a number of CLKA time periods. The synchronous PCKE may then be used to generate a synchronous PCLK signal for the synchronous operation of the integrated circuit memory device.

Figure 4:
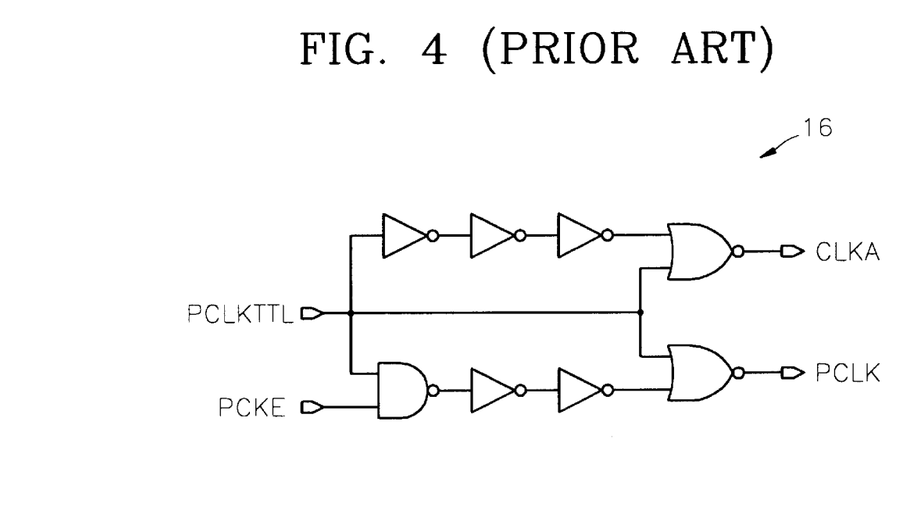
FIG. 4 is a circuit diagram of an internal clock generator according to the prior art.

FIG. 4 is a circuit diagram of an internal clock generator 16 according to the prior art. The internal clock generator 16 generates the synchronous CLKA from the PCLKTTL signal. The internal clock generator 16 also generates a synchronous PCLK signal from the PCLKTTL and the synchronous PCKE signal.

Figure 5:
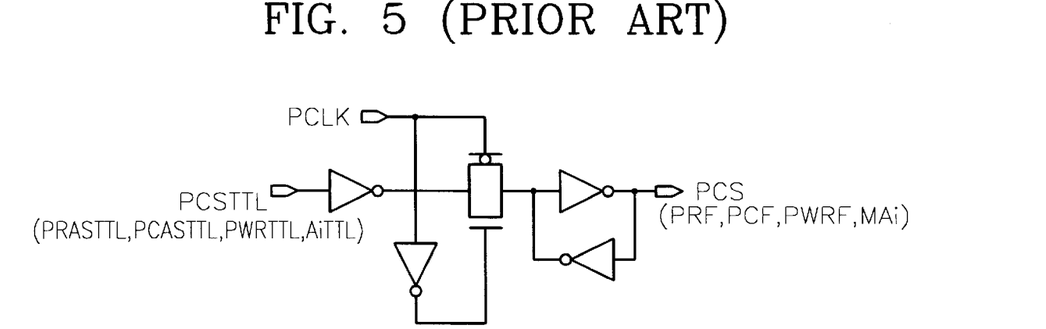
FIG. 5 is a circuit diagram of an internal operation signal generation circuit according to the prior art.

FIG. 5 is a circuit diagram of an internal operation signal generation circuit according to the prior art. The internal operation signal generation circuit provides synchronized control signals for the synchronous operation of the integrated circuit memory device. In particular, the internal operation signal generation circuit may receive various control signals provided to the integrated circuit memory via the input buffers shown in FIG. 1. Accordingly, the internal operation signal generation circuit generates corresponding control signals synchronous with the operation of the PCLK signal.

Figure 6:
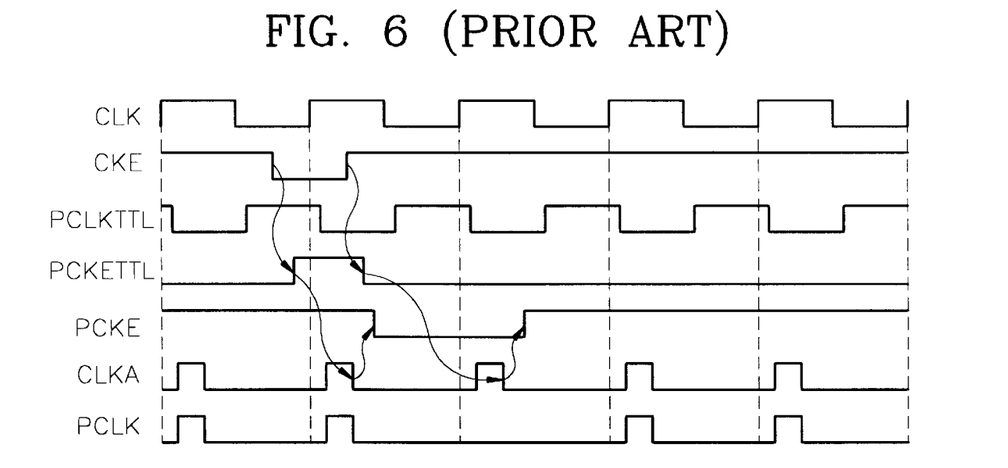
FIG. 6 is a timing diagram that illustrates operations of an operation control circuit according to the prior art.

FIG. 6 is a timing diagram of operations of an operation control circuit according to the prior art. In particular, FIG. 6 illustrates operations in a case wherein the clock enable signal CKE is disabled for a predetermined time and later enabled. When the CKE signal becomes low, the PCKETTL signal transitions to high after a predetermined time, and the PCKE signal becomes low on the falling edge of the CLKA signal. Thus, the PCKE signal is generated synchronously with the CLKA signal. When the PCKE signal becomes low, the generation of the PCLK signal is terminated. However, when the PCKE signal later transitions to a high, the generation of the PCLK signal is resumed.

Figure 7:
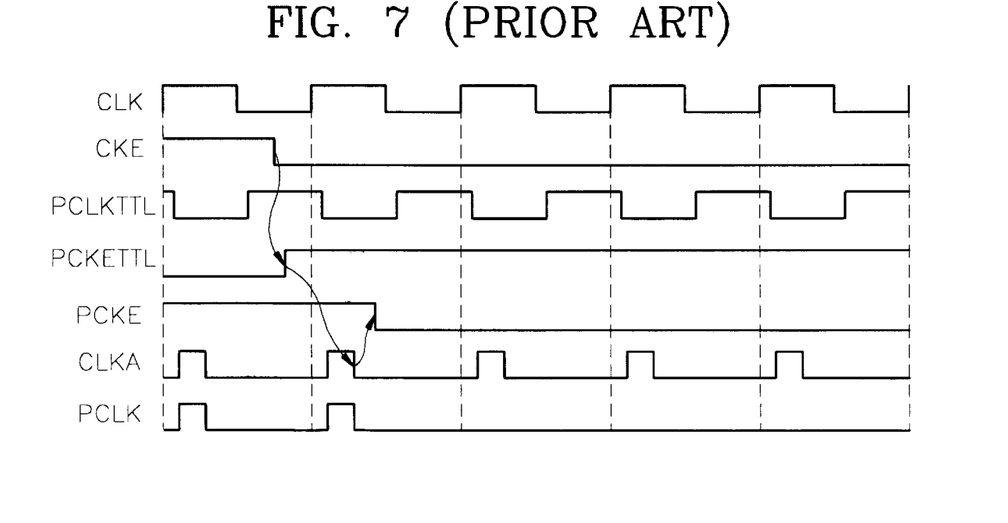
FIG. 7 is a timing diagram that illustrates termination of a PCLK signal according to the prior art.

FIG. 7 is a timing diagram that illustrates the termination of the PCLK signal according to the prior art. In particular, the CKE signal transitions to a low, and thereby generates a PCKETTL signal in the high state. On the next falling edge of the CLKA signal, the PCKE signal transitions to a low state. Subsequently, the generation of the PCLK signal is terminated. Furthermore, the PCKE signal remains in the low state for subsequent transitions of the CLKA signal. Consequently, the PCLK signal is not generated during those subsequent CLKA cycles.

As described above, the synchronous operation in an integrated circuit memory device may be accomplished using a system clock and a synchronous clock enable provided to the integrated circuit memory device. During testing however, the test system may need to supply the clock signal and the clock enable to the integrated circuit memory device under test. Furthermore, to achieve relative efficiency, numerous integrated circuit memory devices may be tested simultaneously. The tester may therefore be required to supply corresponding clock signals and clock enable signals to each of the integrated circuit memory devices undergoing testing.

The tester may therefore require an output channel for each clock and clock enable signal provided to the integrated circuit memory devices undergoing testing. As the number of integrated circuit memory devices undergoing testing increases, so may the number of channels required to provide corresponding clock signals and clock enable signals to the integrated circuit memory devices. As the number of channels increases, fewer integrated circuit memory devices may be tested simultaneously.

In view of the above discussion, there continues to exist a need to improve the efficiency in testing integrated circuit memory devices.

SUMMARY OF THE INVENTION

In view of the above, it is an object of the present invention to provide improved efficiency in testing integrated circuit memory devices having a synchronous operating mode.

It is another object of the present invention to reduce the need for an external clock enable signal when testing the operation of an integrated circuit memory device in synchronous operating mode.

To achieve these and other objects, advantages, and features of the present invention, integrated circuits and methods are provided in which a clock enable signal is generated from a mode command transmitted to the integrated circuit memory device by a tester. Accordingly, the integrated circuit memory device may be free of a clock enable pin. In particular, an internal clock controller generates an internal clock enable signal in response to a mode command. An internal clock generator generates the internal clock signal based on the internal clock enable signal and an external clock.

The mode command may include address signals and a mode register set timing signal to select modes of operation in the integrated circuit memory device. Thus the present invention may allow a tester to direct the integrated circuit memory device under test to generate a clock enable signal internally, thereby reducing the need for the tester to generate an external clock enable signal. Moreover, the address signals and mode register set timing signal may be generated by the tester to control the operation of the integrated circuit memory device in general. Consequently, the tester may use the address signals and mode register set timing signal to provide general operational control and the mode command described herein.

In contrast, a test system for testing conventional integrated circuit memory devices may generate corresponding inputs for the integrated circuit memory device under test. The tester, however, may have limited number of output channels for the generation of input signals for the integrated circuit memory device under test. Consequently, the tester may be limited in the number of integrated circuit memory devices that can be tested simultaneously.

In one aspect of the present invention, the internal clock controller generates the internal clock enable signal in response to a mode register set timing signal and address signals. The mode register set timing signal and the address signals direct the integrated circuit memory device to switch from using the external clock enable signal to the internal clock enable signal or from the internal clock enable signal to the external clock enable signal. In particular, the combination of the address signals indicate which clock enable signal to generate.

In another aspect of the present invention, the internal clock generator selectively generates the internal clock signal based on the internal clock enable signal or an external clock enable signal. Thus an integrated circuit memory device according to the present invention may operate in synchronous mode using the external clock enable or the internal clock enable signal by selecting the appropriate clock enable signal.

According to method aspects of the present invention, an integrated circuit memory device, operating in a synchronous mode, generates an internal clock enable signal in response to a mode command. The internal clock signal is generated based on the internal clock enable signal and an external clock. In particular, the mode command includes a mode register set timing signal and address signals that direct the integrated circuit memory device to generate a clock enable signal internally rather than use an external clock enable signal. Thus, the integrated circuit memory device may be free of a clock enable pin.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 8:
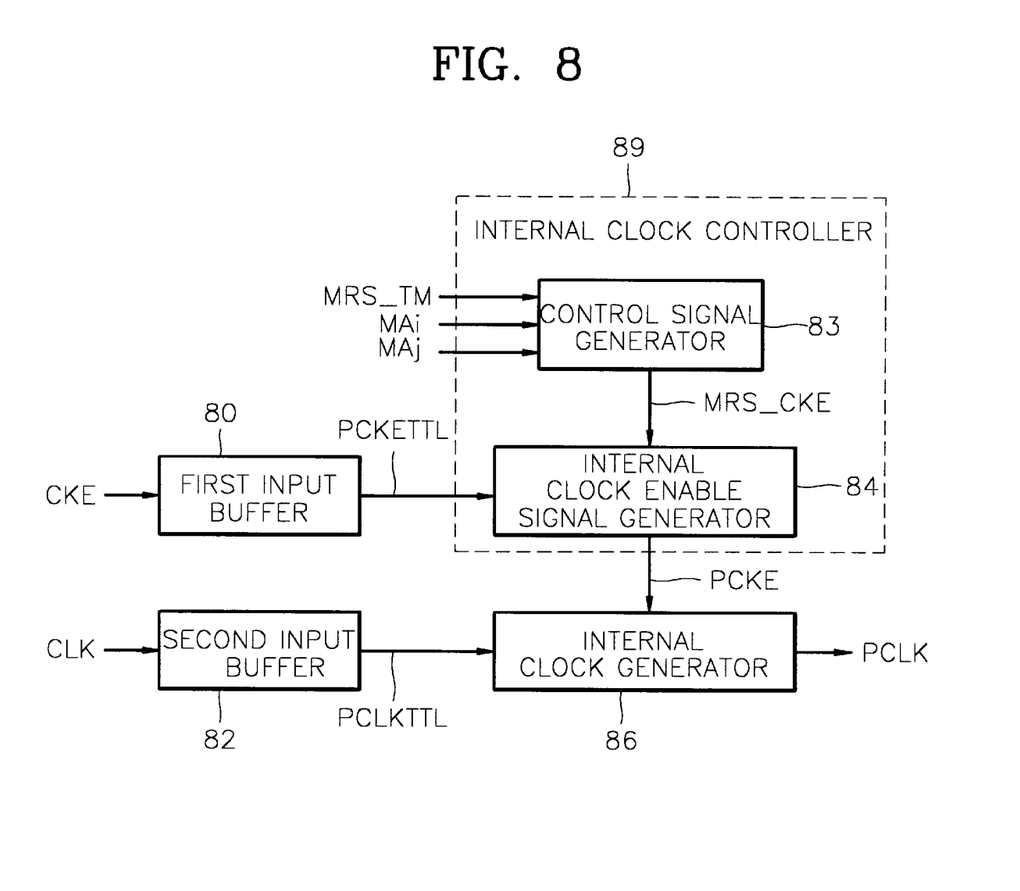
FIG. 8 is a block diagram of operation control circuits and methods of integrated circuit memory devices according to the present invention.

FIG. 8 is a block diagram illustrating operation control circuits and methods of integrated circuit memory devices according to the present invention. A first input buffer 80 receives the external clock enable signal (CKE) and generates a corresponding PCKETTL signal. A second input buffer 82 receives an external system clock (CLK) and generates a corresponding PCLKTTL signal. As described herein, the operation control circuit of the present invention uses the CKE signal to enable and disable the generation of a synchronous PCLK signal that corresponds to the external system clock CLK. Furthermore, the operation control circuits of the present invention operate in an operation mode wherein the integrated circuit memory devices perform typical operations, and in a test mode wherein the functions of the integrated circuit memory device may be tested.

The PCKETTL signal is provided to the internal clock controller 89. The internal clock controller 89 also receives a mode register set timing signal (MRS_TM) and a plurality of addresses (MAi and Maj) generated by an external tester. The MRS_TM signal and the plurality of address signals are used to indicate a mode command, wherein the operation control circuit provides a predetermined timing signal MRS_CKE in response to a particular mode encoded within the mode command. The internal clock controller 89 may then provide the appropriate clock enable signal (either the PCKETTL signal or the MRS_CKE signal) to an internal clock enable signal generator 84. The internal clock enable signal generator 84 generates a PCKE signal based on the clock enable signal provided by the internal clock controller 89.

An internal clock generator 86 uses the PCKE signal to enable the generation of the PCLK signal based on the PCLKTTL signal provided by the second input buffer 82. Thus, the operation control circuit of the present invention generates a synchronous PCLK signal from an external system clock using the clock enable signal that is generated via the mode command. The mode command is provided to the integrated circuit memory device via pins which may be used to test the operation of the integrated circuit memory device. Thus, the PCKE enable signal may be generated without the need for a separate CKE signal generated by the tester. For example, the PCKE signal may be generated via the mode command when the integrated circuit memory device is being tested.

The internal clock controller 89 includes a control signal generator 83 that generates mode register set clock enable signal (MRS_CKE) in response to the mode command. An internal clock enable signal generator 84 receives the MRS_CKE signal from the control signal generator 83 and generates the PCKE signal that controls the generation of the internal clock signal PCLK. The PCKE signal is generated synchronous to the system clock.

Figure 9A:
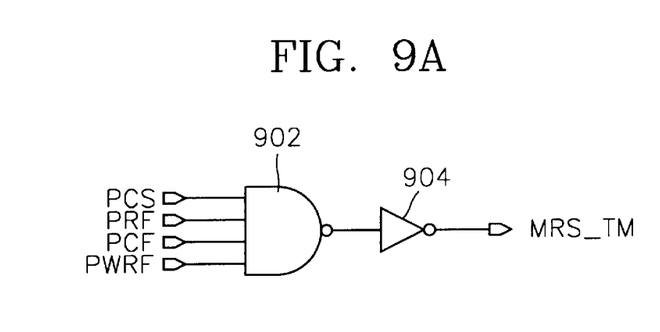
FIG. 9A is a circuit diagram of a mode register set command detection circuit according to the present invention.

FIG. 9A is a circuit diagram of a mode register set (MRS) timing circuit according to the present invention. An MRS timing circuit generates an MRS_TM signal based on the assertion of various control signals provided to the integrated circuit memory device. In particular MRS timing circuit includes a NAND gate 902 that generates a primary MRS_TM signal based on the assertion of a chip select control signal (PCS), a row address strobe control signal (PRF), a column address strobe signal (PCF), and a write control signal (PWRF). When the state of each of the above control signals is on, the NAND gate 902 asserts the primary MRS_TM signal. An inverter 904 then inverts the primary MRS_TM signal, so as to provide an MRS_TM signal.

Figure 9B:
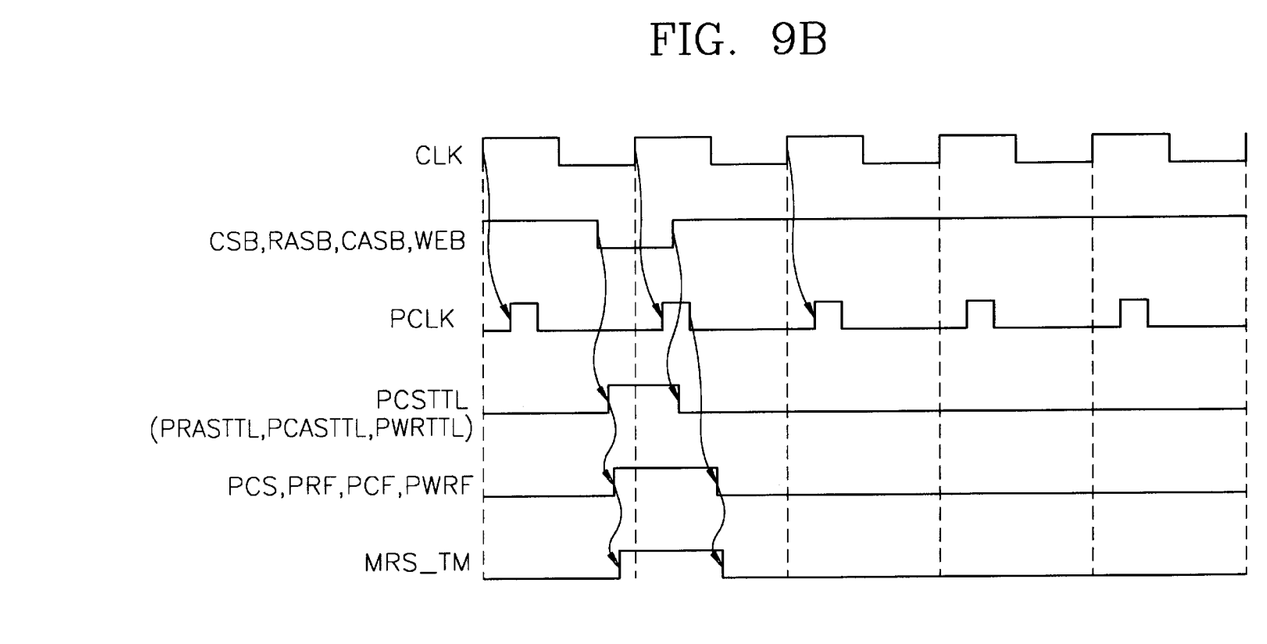
FIG. 9B is a timing diagram that illustrates operations of operation control circuits of an integrated circuit memory device according to the present invention.

FIG. 9B is a timing diagram that illustrates operations of operation control circuits according to the present invention. For example, the MRS_TM signal is generated based on the assertion of the control signals described above and shown in FIG. 9B. In accordance with the NAND gate 902, the assertion of the control signals provide for the generation of the MRS_TM signal, as shown in FIG. 9B.

Figure 10:
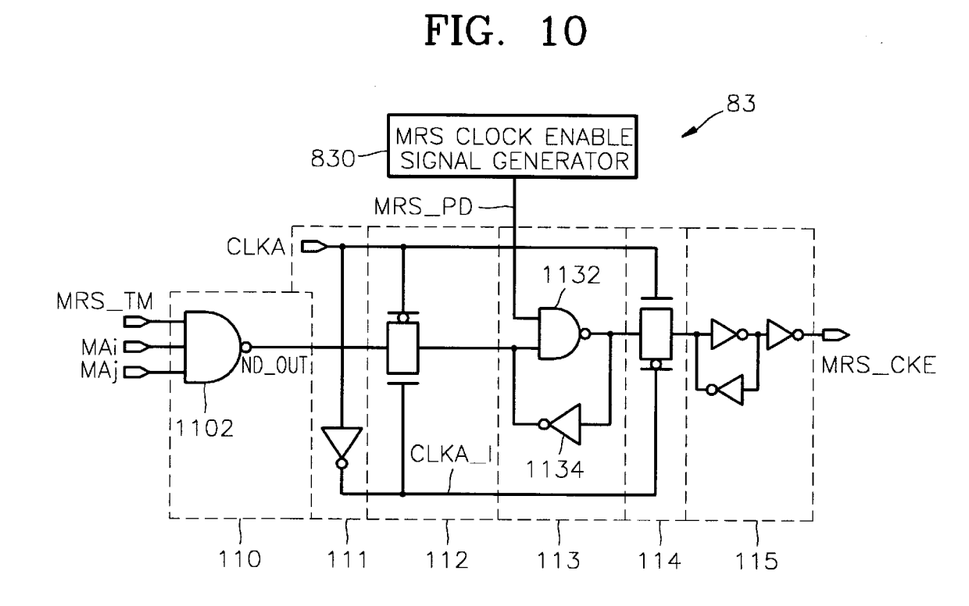
FIG. 10 is a block diagram of a control signal generator according to the present invention.

FIG. 10 is a block diagram of a control signal generator according to the resent invention. A control signal generator 83 includes a detector 110 that detects a ode command based on the mode register set timing signal MRS_TM and a combination of address signals. The detector 110 produces an output signal. A first operation control clock supply portion 111 generates a first operation control clock signal based on an external operation control clock signal. A first transfer gate portion 112 receives the output signal from the detector 110 and transfers the output signal in response to the first operation control clock signal. A mode register set clock enable signal generator 83 generates a mode register set clock enable signal based on the mode register set timing signal, the combination of address signals and a power stabilizing signal. A load register set timing signal generator 113 inverts the mode register set clock enable signal and generates a first signal based on the transferred output signal.

A second transfer gate portion 114 transfers the first signal in response to the first operation control clock signal so as to provide a second signal. A latch portion 115 latches the second signal and inverts the second signal, so as to provide the MRS_CKE signal.

Figure 11:
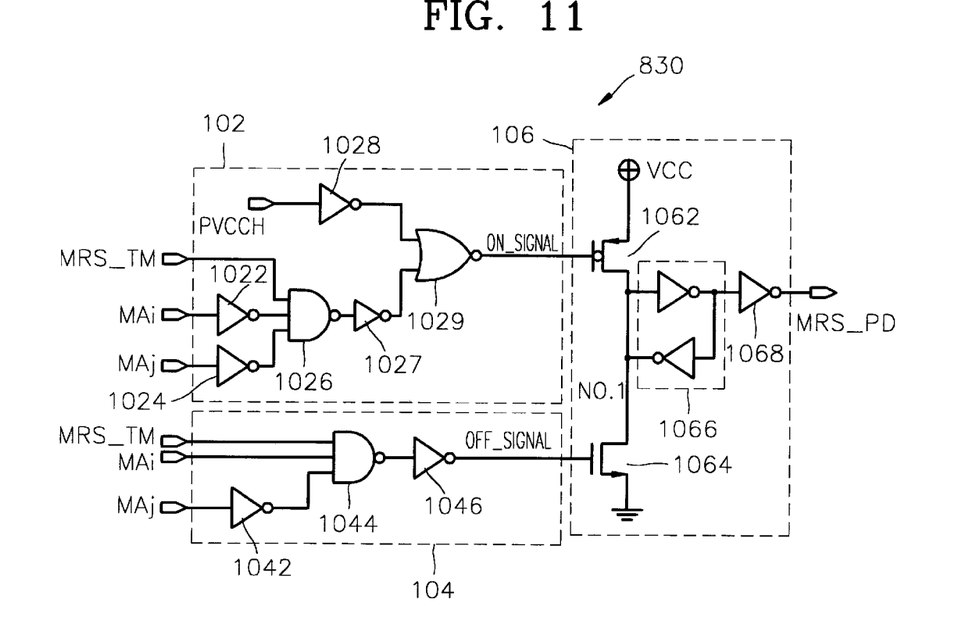
FIG. 11 is a block diagram of a mode register set clock enable signal generator according to the present invention.

FIG. 11 is a circuit diagram of the mode register set clock enable signal generator of FIG. 10. The mode register set clock enable signal generator 830 includes a first timing combination portion 102 that generates an on signal based on the mode register set timing signal and a combination of address signals (MAi and MAj) and a power stabilized signal. A second timing combination portion 104 generates an off signal based on the mode register set timing signal and the combination of address signals. An output portion 106 generates an MRS_PD signal based on the on signal and the off signal.

In a preferred aspect of the control signal generator 83 illustrated in FIG. 10, the detector 110 includes a NAND gate 1102 that logically NANDs the mode register set timing signal and the combination of address signals, so as to provide a NAND gate output. The mode register set timing signal generator 113 includes a NAND gate that logically NANDs the mode register set clock enable signal and the first transfer output, so as to provide a primary mode register set clock enable. An inverter 1134 inverts the primary mode register set clock enable, so as to produce an inverted primary mode register set clock enable. The inverted primary mode register set clock enable is provided to an input of the NAND gate 1132.

In a preferred embodiment of the mode register set clock enable signal generator 830, the first timing combination portion 102 includes a first inverter 1022 that inverts a first address signal (MAi), so as to provide a first inverter output. A second inverter 1024 inverts a second address signal (MAj) so as to provide a second inverter output. A third inverter 1028 inverts the power stabilized signal so as provide a third inverter output. A NAND gate 1026 logically NANDs the mode register set timing signal and the first inverter output and the second inverter output, so as to provide a NAND gate output. A fourth inverter 1027 inverts the NAND gate output so as to provide a fourth inverter output. A NOR gate 1029 logically NORs the fourth inverter output and the third inverter output, so as to provide the on signal.

In another preferred aspect of the mode register set clock enable signal generator 830, the second timing combination portion 104 includes a first inverter 1042 that inverts the second address signal (MAj), so as to provide a first inverter output. A NAND gate 1044 logically NANDs the mode register set timing signal and the first address signal (MAi) and the first inverter output, so as to provide a NAND gate output. A second inverter 1046 inverts the NAND gate output so as to produce the off signal.

In another preferred aspect of the mode register set clock enable signal generator 830, the output portion 106 includes a PMOS gate 1062. The PMOS gate 1062 includes a gate node that is responsive to the on signal and a source node that is responsive to a power supply voltage terminal, and drain node that provides a buffered on signal. An NMOS gate 1064 includes a gate node that is responsive to the off signal, a source node connected to a ground terminal, and a drain node that is responsive to the drain node of the PMOS gate 1062. The NMOS gate 1064 provides a buffered off signal. A latch portion 1066 latches the buffered on signal or the buffered off signal, so as to provide a latched signal. An inverter 1068 inverts the latch signal, so as to provide the MRS_PD signal.

Figure 12:
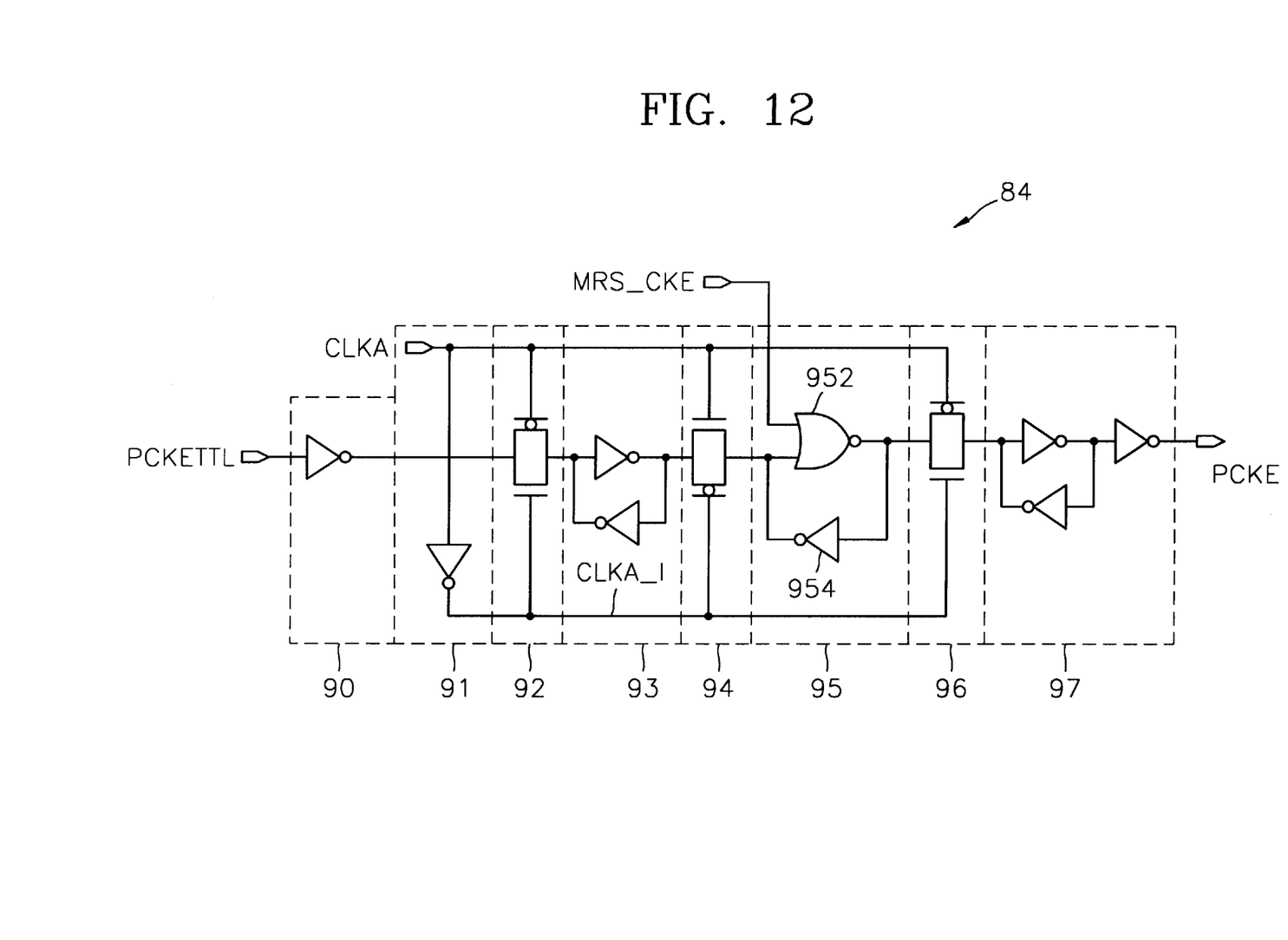
FIG. 12 is a block diagram of an internal clock enable signal generator according to the present invention.

FIG. 12 is a circuit diagram of the internal clock enable signal generator 84.

The internal clock enable signal generator 84 generates the PCKE signal based on either the mode register set clock enable signal generated by the control signal generator 83 or the external clock enable signal PCKETTL. The internal clock enable signal generator 84 includes a first inverter stage 90 that inverts the PCKETTL signal, so as to provide an inverted PCKETTL signal. A first operation control clock supply portion 91 includes a second inverter that inverts an external operation control clock, so as to provide an inverted external operation control clock. A first transfer gate 92 transfers the inverted PCKETTL signal in response to the external operation control clock and the inverted external operation control clock, so as to provide a first transfer clock enable signal. A first latch portion 93 latches the first transfer clock enable, so as to provide a latched clock enable signal. A second transfer gate 94 transfers the latched clock enable signal, so as to provide a second transfer clock enable signal. A clock enable signal selector 95 selects the second transfer clock enable signal or the MRS_CKE signal, so as to provide a selected clock enable signal. A third transfer gate 96 transfers the selected clock enable signal in response to the external operation control clock and the inverted external operation control clock, so as to provide a second transfer clock enable signal. A second latch portion 97 latches the second transfer clock enable signal, so as to provide the PCKE signal. In a preferred aspect of the internal clock enable signal generator 84, the clock enable signal selector 95 includes a NOR gate 952 that logically NORs the MRS_CKE signal and the second transfer clock enable signal, so as to provide the selected clock enable signal. An inverter 954 inverts the selected clock enable signal so as to provide an inverted selected clock enable signal. The inverted selected clock enable signal is provided to an input of the NOR gate 952.

Figure 13:
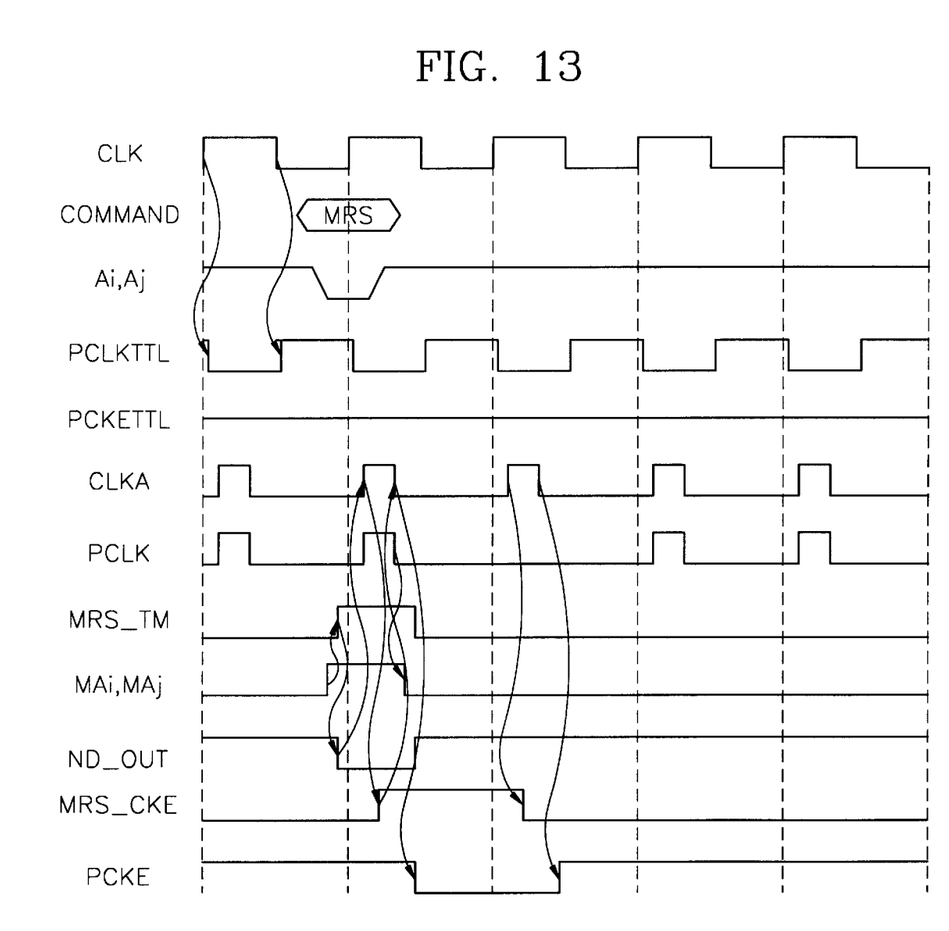
FIGS. 13 and 14 are timing diagrams that illustrate operations of an operation control circuit according to the present invention.

FIG. 13 is a timing diagram that illustrates methods of operation of an operation control circuit according to the present invention. As illustrated in FIG. 13, the PCKETTL signal is static. The PCKE signal is generated via the MRS mode command. In particular, the MRS mode command and the particular address signal combination is received on the rising edge of the CLK signal. The generation of the MRS_TM signal and the combination of address signals included in the mode command are used to generate the MRS_CKE signal on the respective rising edges of CLKA. Thus, the PCKE signal is generated on the falling edge of CLKA based on the MRS_CKE signal. Thus, the operations shown in FIG. 13 illustrate how the PCKE signal is generated in the absence of the PCKETTL signal.

Figure 14:
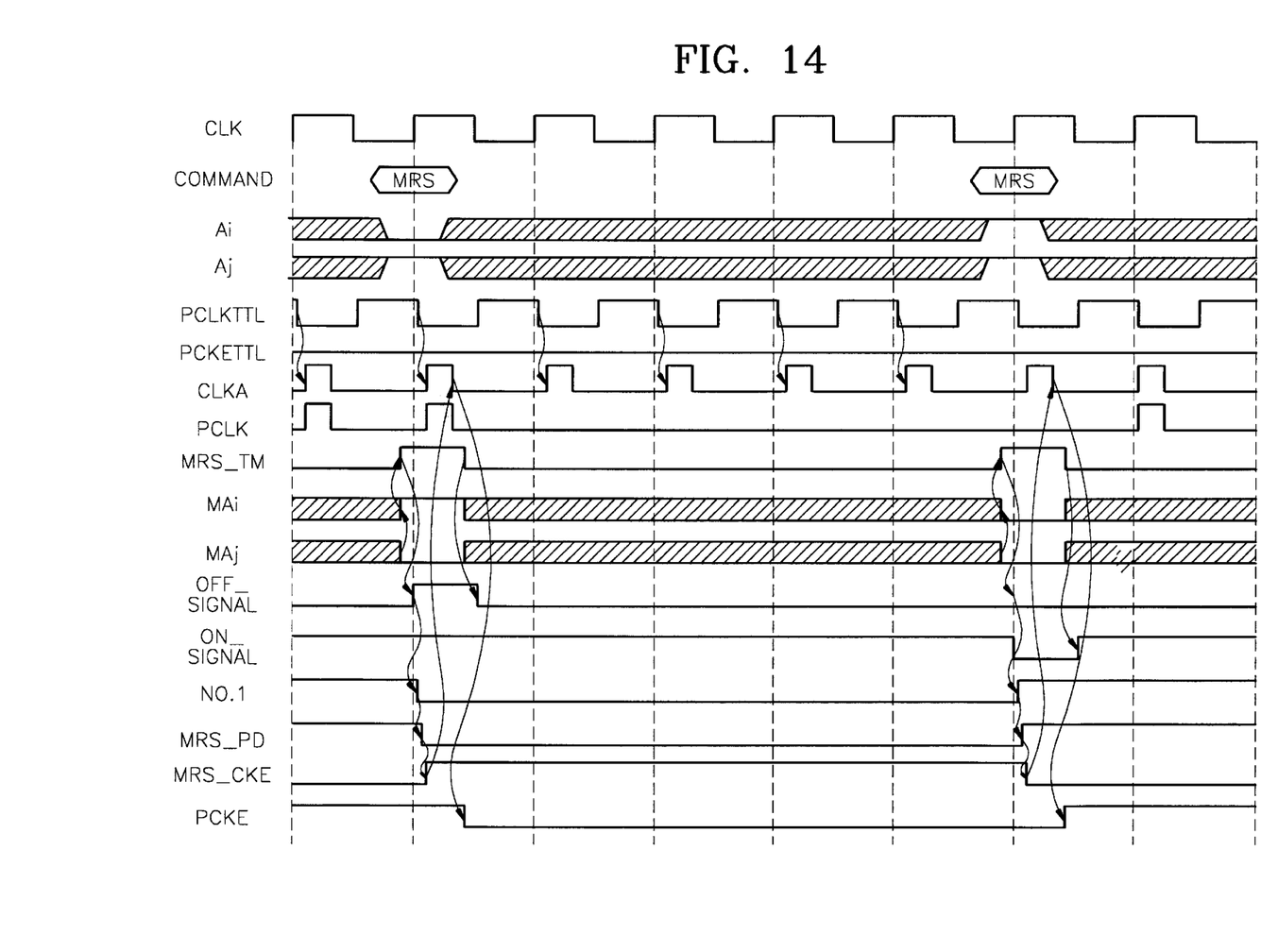

FIG. 14 is a timing diagram that illustrates further operations of an operation control circuit according to the present invention. Initially, an MRS mode command is received. The MRS mode command indicates that the integrated circuit memory device should switch from using the PCKETTL signal to the MRS_CKE signal to generate the PCKE signal. In particular, the MRS_TM signal and the combination of address signals MAi and MAj are provided to the MRS clock enable signal generator 830 to produce the on signal. The generation of the on signal then leads to the generation of the MRS_PD by the MRS clock enable signal generator 830. The control signal generator then generates the MRS_CKE signal on corresponding edges of the CLKA signal based on the MRS_PD signal. The internal clock enable signal generator 84 then generates the PCKE signal based on the MRS_CKE signal provided by the control signal generator 830. Thus, the MRS mode command is used to disable the internal generation of the PCLK signal by turning off the PCKE signal.

Later, another MRS_TM signal and corresponding address signals MAi and MAj are received, indicating that the PCKE signal should be reasserted and therefore PCLK should be generated. In particular, the MRS_TM signal and address signals MAi and MAj are provided to the MRS clock enable signal generator 830, that generates the off signal, which in turn generates the MRS, which in turn causes the MRS_PD signal to return to the high state. The MRS_PD signal is then used by the control signal generator 83 to generate the MRS_CKE signal on the corresponding edge of CLKA. Thus, the PCKE signal is used to reenable the internal generation of PCLK.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An operation control circuit of an integrated circuit memory device that operates in a synchronous mode according to an internal clock signal, the operation control circuit comprising:

an internal clock controller that generates an internal clock enable signal in response to a plurality of address signals; and an internal clock generator, responsive to the internal clock controller, that generates the internal clock signal for the integrated circuit memory device based on the internal clock enable signal and an external clock.

2. The operation control circuit of claim 1, wherein the internal clock generator comprises an internal clock generator that selectively generates the internal clock signal based on the internal clock enable signal or an external clock enable signal.

3. The operation control circuit of claim 1, wherein the internal clock controller comprises an internal clock controller that generates the internal clock enable signal in response to a mode register set timing signal and a plurality of address signals.

4. The operation control circuit of claim 1, wherein the internal clock controller comprises:

a control signal generator that generates an internal control signal in response to the mode command; and an internal clock enable signal generator, responsive to the control signal generator, that generates the internal clock enable signal so as to control generation of the internal clock signal.

5. The operation control circuit of claim 4, wherein a mode command includes a mode register set timing signal and a plurality of address signals, and wherein the control signal generator comprises:

a detector that detects the mode command based on the mode register set timing signal and the plurality of address signals so as to provide an output signal;

a first operation control clock supply portion that generates a first operation control clock signal based on an external operation control clock signal;

a first transfer gate portion, responsive to the detector, that transfers the output signal in response to the first operation control clock signal;

a mode register set clock enable signal generator that generates a mode register set clock enable signal based on the mode register set timing signal, the plurality of address signals, and a power stabilizing signal;

a mode register set timing signal generator, responsive to the first transfer gate portion and the mode register set clock enable signal generator, that inverts the mode register set clock enable signal and generates a first signal based on the transferred output signal;

a second transfer gate portion, responsive to the mode register set timing signal generator, that transfers the first signal in response to the first operation control clock signal so as to provide a second signal; and a latch portion, responsive to the second transfer portion, that latches the second signal and inverts the second signal so as to provide an internal clock enable signal.

6. The operation control circuit of claim 5, wherein the mode register set clock enable signal generator comprises:

a first timing combination portion that generates an on signal based on the mode register set timing signal and the plurality of address signals and a power stabilized signal;

a second timing combination portion that generates an off signal based on the mode register set timing signal and the plurality of address signals; and an output portion, responsive to the first and second timing combination portions, that generates the mode register set clock enable signal based on the on signal and the off signal.

7. The operation control circuit of claim 6, wherein the first timing combination portion comprises:

a first inverter that inverts a first of the plurality of address signals so as to provide a first inverter output;

a second inverter that inverts a second of the plurality of address signals so as to provide a second inverter output;

a third inverter that inverts the power stabilized signal so as to provide a third inverter output;

a NAND gate, responsive to the first and second inverters, that logically NANDs the mode register set timing signal and the first inverter output and the second inverter output so as to provide a NAND gate output;

a fourth inverter, responsive to the NAND gate, that inverts the NAND gate output so as to provide a fourth inverter output; and a NOR gate, responsive to the fourth inverter and the third inverter, that logically NORs the fourth inverter output and the third inverter output so as to provide the on signal.

8. The operation control circuit of claim 6, wherein the second timing combination portion comprises:

a first inverter that inverts a first of the plurality of address signals so as to provide a first inverter output;

a NAND gate, responsive to the first inverter, that logically NANDs the mode register set timing signal and a second of the plurality of address signals and the first inverter output so as to provide a NAND gate output; and a second inverter, responsive to the NAND gate, that inverts the NAND gate output so as to produce the off signal.

9. The operation control circuit of claim 6, wherein the output portion comprises:

a PMOS gate having a gate node responsive to the on signal, a source node responsive to a power supply voltage terminal, and a drain node that provides a buffered on signal;

an NMOS gate having a gate node responsive to the off signal, a source node connected to a ground terminal, and a drain node responsive to the drain node of the PMOS gate, that provides a buffered off signal;

a latch portion, responsive to the drain node of the PMOS gate, that latches the buffered on signal or the buffered off signal so as to provide a latched signal; and an inverter, responsive to the latch portion, that inverts the latched signal so as to provide the mode register set clock enable signal.

10. The operation control circuit of claim 4, wherein the control signal generator comprises:

a first NAND gate that logically NANDs the mode register set timing signal and the plurality of address signals so as to provide a first NAND gate output;

a first inverter that inverts an external operation control clock so as to provide an inverted external operation control clock;

a mode register set clock enable signal generator that produces a mode register set clock enable signal;

a first transfer gate, responsive to the first NAND gate, that transfers the first NAND gate output in response to the external operation control clock and the inverted external operation control clock so as to provide a first transfer output;

a second NAND gate, responsive to the mode register set clock enable signal generator and the first transfer gate, that logically NANDs the mode register set clock enable signal and the first transfer output so as to provide a primary mode register set clock enable signal;

a second transfer gate, responsive to the second NAND gate, that transfers the primary mode register set clock enable signal in response to the external operation control clock and the inverted external operation control clock so as to provide a second transfer mode register set clock enable signal; and a latch portion, responsive to the second transfer gate, that latches the second transfer mode register set clock enable signal so as to provide the mode register set clock enable signal.

11. The operation control circuit of claim 4, wherein the internal clock enable signal generator comprises:

a first inverter that inverts the external clock enable signal so as to provide an inverted external clock enable signal;

a second inverter that inverts an external operation control clock so as to provide an inverted external operation control clock;

a first transfer gate, responsive to the first inverter, that transfers the inverted external clock enable signal in response to the external operation control clock and the inverted external operation control clock so as to provide a first transfer clock enable signal;

a first latch portion, responsive to the first transfer gate, that latches the first transfer clock enable signal so as to provide a latched clock enable signal;

a second transfer gate, responsive to the first latch, that transfers the latched clock enable signal so as to provide a second transfer clock enable signal;

a clock enable signal selector, responsive to the second transfer gate and a mode register set clock enable signal, that selects the second transfer clock enable signal or the mode register set clock enable signal so as to provide a selected clock enable signal;

a third transfer gate, responsive to the clock enable signal selector, that transfers the selected clock enable signal in response to the external operation control clock and the inverted external operation control clock so as to provide a second transfer clock enable signal; and a second latch portion, responsive to the third transfer gate, that latches the second transfer clock enable signal so as to provide the internal clock enable signal.

12. A method of operating an integrated circuit memory device in a synchronous mode according to an internal clock signal, the method comprising:

generating an internal clock enable signal in response to a plurality of address signals; and generating the internal clock signal for the integrated circuit memory device based on the internal clock enable signal and an external clock.

13. The method of claim 12, wherein the step of generating an internal clock enable signal comprises generating the internal clock enable signal in response to a mode register set timing signal and a plurality of address signals.

14. The method of claim 12, wherein the step of generating an internal clock enable signal comprises:

generating an internal control signal in response to the mode command; and generating the internal clock enable signal so as to control generation of the internal clock signal.

15. The method of claim 14, wherein the step of generating an internal clock enable signal comprises generating an internal clock enable signal, wherein a mode command includes a mode register set timing signal and a plurality of address signals, and wherein the step of generating an internal clock signal comprises:

detecting the mode command based on the mode register set timing signal and the plurality of address signals;

generating a first operation control clock signal based on an external operation control clock signal;

transferring the output signal in response to the first operation control clock signal;

generating a mode register set clock enable signal based on the mode register set timing signal, the plurality of address signals, and a power stabilizing signal;

inverting the mode register set clock enable signal and generates a first signal based on the transferred output signal;

transferring the first signal in response to the first operation control clock signal so as to provide a second signal; and latching the second signal and inverting the second signal so as to provide an internal clock enable signal.

16. The method of claim 15, wherein the step of generating a mode register set clock enable comprises:

generating an on signal based on the mode register set timing signal and the plurality of address signals and a power stabilized signal;

generating an off signal based on the mode register set timing signal and the plurality of address signals; and generating the mode register set clock enable signal based on the on signal and the off signal.

17. A method of operating an integrated circuit memory device in a synchronous mode according to an internal clock signal, the method comprising:

generating an internal clock enable signal in response to a plurality of address signals; and selectively generating the internal clock signal for the integrated circuit memory device based on the internal clock enable signal or an external clock enable signal.

18. The method of claim 17, wherein the step of selectively generating comprises:

applying the external clock enable signal and an external clock signal to the integrated circuit memory device during an operational mode; and applying the plurality of address signals and the external clock signal to the integrated circuit memory device during a test mode.

19. An operation control circuit of an integrated circuit memory device in a synchronous mode according to an internal clock signal, the operation control circuit comprising:

means for generating an internal clock enable signal in response to a plurality of address signals; and means for generating the internal clock signal for the integrated circuit memory device based on the internal clock enable signal and an external clock.

20. The operation control circuit of claim 18, wherein the means for generating an internal clock enable signal comprises means for generating the internal clock enable signal in response to a mode register set timing signal and a plurality of address signals.

21. The operation control circuit of claim 18, wherein the means for generating an internal clock enable signal comprises:

means for generating an internal control signal in response to the mode command; and means for generating the internal clock enable signal so as to control generation of the internal clock signal.

22. The operation control circuit of claim 21, wherein the means for generating an internal clock enable signal comprises means for generating an internal clock enable signal, wherein a mode command includes a mode register set timing signal and a plurality of address signals, and wherein the means for generating an internal clock signal comprises:

means for detecting the mode command based on the mode register set timing signal and the plurality of address signals;

means for generating a first operation control clock signal based on an external operation control clock signal;

means for transferring the output signal in response to the first operation control clock signal;

means for generating a mode register set clock enable signal based on the mode register set timing signal, the plurality of address signals, and a power stabilizing signal;

means for inverting the mode register set clock enable signal and generates a first signal based on the transferred output signal;

means for transferring the first signal in response to the first operation control clock signal so as to provide a second signal; and means for latching the second signal and inverting the second signal so as to provide an internal clock enable signal.

23. The operation control circuit of claim 22, wherein the means for generating a mode register set clock enable comprises:

means for generating an on signal based on the mode register set timing signal and the plurality of address signals and a power stabilized signal;

means for generating an off signal based on the mode register set timing signal and the plurality of address signals; and means for generating the mode register set clock enable signal based on the on signal and the off signal.

24. An operation control circuit of an integrated circuit memory device in a synchronous mode according to an internal clock signal, the operation control circuit comprising:

means for generating an internal clock enable signal in response to a mode command; and     means for selectively generating the internal clock signal based on the internal clock enable signal or an external clock enable signal.

25. The operational control circuit of claim 24, wherein the means for selectively generating comprises:

means for applying the external clock enable signal and an external clock signal to the integrated circuit memory device during an operational mode; and     means for applying the plurality of address signals and the external clock signal to the integrated circuit memory device during a test mode.

* * * * *